(12) United States Patent
Baisl

(10) Patent No.: US 9,112,165 B2
(45) Date of Patent: Aug. 18, 2015

(54) METHOD FOR PRODUCING AN OPTOELECTRONIC COMPONENT, AND OPTOELECTRONIC COMPONENT

(71) Applicant: OSRAM Opto Semiconductors GmbH, Regensburg (DE)

(72) Inventor: Richard Baisl, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/359,580

(22) PCT Filed: Nov. 20, 2012

(86) PCT No.: PCT/EP2012/073091
§ 371 (c)(1),
(2) Date: May 21, 2014

(87) PCT Pub. No.: WO2013/076073
PCT Pub. Date: May 30, 2013

(65) Prior Publication Data
US 2014/0291662 A1 Oct. 2, 2014

(30) Foreign Application Priority Data
Nov. 21, 2011 (DE) .......................... 10 2011 086 689

(51) Int. Cl.
*H01L 51/52* (2006.01)
*H01L 51/44* (2006.01)
(Continued)

(52) U.S. Cl.
CPC .......... *H01L 51/441* (2013.01); *H01L 51/0017* (2013.01); *H01L 51/5203* (2013.01); *H01L 51/5253* (2013.01); *H01L 51/56* (2013.01)

(58) Field of Classification Search
CPC ... H01L 51/441; H01L 51/5253; H01L 51/56; H01L 51/0017; H01L 51/5203
See application file for complete search history.

(56) References Cited

U.S. PATENT DOCUMENTS 5,501,893 A * 3/1996 Laermer et al. ................ 428/161
6,198,220 B1 * 3/2001 Jones et al. ................... 313/512
7,820,999 B2 10/2010 Huisman et al.
(Continued)

FOREIGN PATENT DOCUMENTS

CN 1386391 A 12/2002
DE 10222964 A1 11/2003
(Continued)

OTHER PUBLICATIONS

International Preliminary Report on Patentability issued in the corresponding PCT application No. PCT/EP2012/073091, dated May 27, 2014.
(Continued)

*Primary Examiner* — Roy Potter
*Assistant Examiner* — Paul Patton

(57) ABSTRACT

A method for producing an optoelectronic component may include forming a first electrode on a substrate, forming an organic functional layer structure on the first electrode; forming a second electrode on the organic functional layer structure, forming at least one contact for making contact with the first and/or second electrode, forming an encapsulation layer above the layer structure and the contact, removing the encapsulation layer above the contact with the aid of an anisotropic etching method, and cooling the substrate during the anisotropic etching method.

26 Claims, 2 Drawing Sheets

(51) Int. Cl.
*H01L 51/00* (2006.01)
*H01L 51/56* (2006.01)

(56) References Cited

U.S. PATENT DOCUMENTS

| | | | |
|---|---|---|---|
| 8,536,783 B2* | 9/2013 | Boerner et al. | 313/506 |
| 2002/0113241 A1 | 8/2002 | Kubota et al. | |
| 2003/0205845 A1* | 11/2003 | Pichler et al. | 264/272.11 |
| 2003/0207500 A1 | 11/2003 | Pichler et al. | |
| 2008/0315440 A1* | 12/2008 | Dekker et al. | 257/787 |
| 2009/0191342 A1* | 7/2009 | Chu et al. | 427/264 |
| 2012/0267147 A1 | 10/2012 | Ingle et al. | |
| 2012/0319553 A1* | 12/2012 | Silvernail et al. | 313/46 |

FOREIGN PATENT DOCUMENTS

| | | |
|---|---|---|
| DE | 602004005685 T2 | 12/2007 |
| DE | 102009003970 A1 | 7/2010 |
| DE | 102009060066 A1 | 3/2011 |
| EP | 2136606 A1 | 12/2009 |
| JP | 2002222691 A | 8/2002 |
| JP | 2003347045 A | 12/2003 |
| JP | 2004014236 A | 1/2004 |
| JP | 2007080569 A | 3/2007 |
| TW | 515223 B | 12/2002 |
| WO | 2010077544 A1 | 7/2010 |

OTHER PUBLICATIONS

English abstract of DE 10222964 A1 of Nov. 6, 2003.
English abstract of DE 102009003970 A1 of Jul. 15, 2010.
Search Report issued in the corresponding German application No. 102011086689.2, dated Aug. 17, 2012.
Korean Office Action based on application No. 10-2014-7017215 (4 pages) dated Mar. 30, 2015 (for reference purpose only).

* cited by examiner

METHOD FOR PRODUCING AN OPTOELECTRONIC COMPONENT, AND OPTOELECTRONIC COMPONENT

RELATED APPLICATIONS

The present application is a national stage entry according to 35 U.S.C. §371 of PCT application No.: PCT/EP2012/073091 filed on Nov. 20, 2012, which claims priority from German application No.: 102011086689.2 filed on Nov. 21, 2011, and is incorporated herein by reference in its entirety.

TECHNICAL FIELD

Various embodiments relate to a method for producing an optoelectronic component, and to an optoelectronic component.

BACKGROUND

Optoelectronic components including organic functional layers often have encapsulation layers above the organic functional layers, which protect the organic functional layers, for example against moisture. The encapsulation layers are applied for example by means of deposition methods, for example by means of atomic layer deposition or chemical vapor deposition. Applying the encapsulation layers involves encapsulating not only the organic functional layers, but also contacts provided for making contact with electrodes between which the organic functional layers are arranged. Making contact with such coated, encapsulated contacts cannot be carried out in a simple manner. In order to expose the contacts it is known to uncover them by scraping manually, which is very time-consuming and thus costly.

SUMMARY

Various embodiments provide a method for producing an optoelectronic component, and an optoelectronic component, wherein the contacts can be exposed in a simple manner.

Various embodiments provide a method for producing an optoelectronic component. The method can include: forming a first electrode on a substrate; forming an organic functional layer structure on the first electrode; forming a second electrode on the organic functional layer structure; forming at least one contact for making contact with the first and/or second electrode; forming an encapsulation layer above the layer structure and the contact; and removing the encapsulation layer above the contact with the aid of an anisotropic etching method.

Exposing the contact with the aid of the anisotropic etching method can contribute to exposing the contact rapidly and/or simply and/or exposing a large number of contacts simultaneously. This can contribute to reducing production durations and production costs for producing the optoelectronic component in a simple manner. One, two or more contacts can be provided and exposed with the aid of the anisotropic etching method. The contacts can be assigned to one optoelectronic component or to a plurality of optoelectronic components, in particular to one organic functional layer structure or a plurality of organic functional layer structures. The contact or contacts can be arranged alongside the corresponding organic functional layer structure.

In accordance with various embodiments, the optoelectronic component is a light-emitting component, for example an organic light-emitting diode. As an alternative thereto, in various embodiments, the optoelectronic component can be a light-absorbing component, for example an organic solar cell.

In accordance with various embodiments, a dry etching method is carried out as the anisotropic etching method. By way of example, a physical or physical-chemical dry etching method can be carried out as the dry etching method. The dry etching method can be for example a plasma-enhanced etching method, for example an ICP plasma method.

In accordance with various embodiments, a cover is arranged above the layer structure on the encapsulation layer, said cover serving as an etching stop for the encapsulation layer above the layer structure during the anisotropic etching method. This contributes simply and effectively to protecting the encapsulation layer and the layer structure, for example during the anisotropic etching method or else after the anisotropic etching method has been carried out, for example also after the completion of the optoelectronic component.

In accordance with various embodiments, the cover is fixed with the aid of adhesive. This contributes to fixing the cover on the encapsulation layer in a simple manner.

In accordance with various embodiments, the adhesive is applied such that it serves as an etching stop for the encapsulation layer above the layer structure during the anisotropic etching method. The adhesive then serves not only for fixing the cover, but also as protection of the encapsulation layer during the anisotropic etching method. In this context it can be advantageous to apply the adhesive such that it covers at least one flank of the layer structure and thus serves as an etching stop for the corresponding flank during the anisotropic etching method. If the layers of the layer structure lie one on top of another in a vertical direction, then the flanks of the layer structure constitute those sides of the layer structure at which the layer structure ends in a horizontal direction. By way of example, the adhesive can be applied such that it covers the flanks of the layer structure, with the result that the flanks of the layer structure are laterally protected in a simple manner.

In accordance with various embodiments, a lacquer is applied above and/or alongside the layer structure in such a way that the lacquer serves as an etching stop for the layer structure and/or a flank of the layer structure during the anisotropic etching method. The lacquer can be applied in addition or as an alternative to the adhesive and/or the cover. The lacquer correspondingly makes it possible, in addition or as an alternative to the cover and the adhesive, to protect the encapsulation layer and/or the layer structure during the anisotropic etching method.

In accordance with various embodiments, the contact is embodied such that it serves as its own etching stop and/or as an etching stop for the substrate during the anisotropic etching method. For this purpose, the contact is formed for example from a material which is not removed, or is only slightly removed, during the anisotropic etching method. By way of example, the contact can include chromium or be formed therefrom.

In accordance with various embodiments, the substrate is cooled before and/or during the anisotropic etching method. In known anisotropic etching methods, temperatures at which the organic functional layer structure can incur damage can occur. Cooling the substrate can contribute to rapidly transporting away the heat absorbed by the optoelectronic component during the anisotropic etching method, and thus to protecting the organic functional layer structure against excessive heat. This yields a high degree of latitude when choosing the anisotropic etching method and when predefining process parameters for the anisotropic etching method.

In accordance with various embodiments, the encapsulation layer is also applied on a rear side of the substrate facing away from the layer structure. The encapsulation layer is subsequently removed on the rear side with the aid of the anisotropic etching method or an additional anisotropic etching method. This contributes to removing the encapsulation layer on the rear side in a simple manner.

In accordance with various embodiments, at least one further encapsulation layer is formed above the layer structure and the contact. Both encapsulation layers above the contact are removed with the aid of the anisotropic etching method.

Various embodiments provide an optoelectronic component embodied with the aid of the method as claimed in any of the preceding claims.

The configurations of the method for producing the optoelectronic component correspondingly apply, insofar as is practical, to the optoelectronic component itself.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form part of this description and show for illustration purposes specific embodiments in which the disclosure can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, an optoelectronic component can be embodied as a light-absorbing component, for example as a solar cell, or as a light-emitting component, for example as an organic light-emitting diode (OLED), or as an organic light-emitting transistor. In various embodiments, the light-emitting component can be part of an integrated circuit. Furthermore, a plurality of light-emitting components can be provided, for example in a manner accommodated in a common housing.

Figure 1:
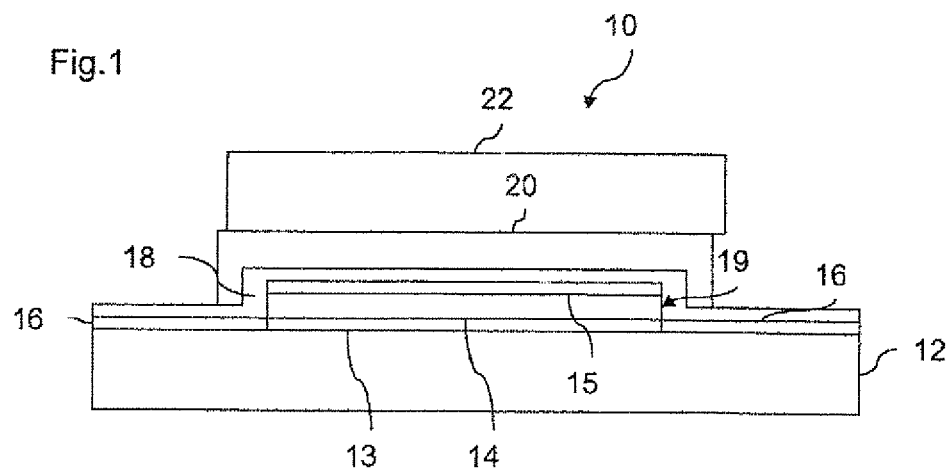
FIG. 1 shows an embodiment of an optoelectronic component during a step of a production process.

FIG. 1 shows a cross-sectional view of an organic light-emitting component 10 in accordance with various embodiments in a step of a production process.

The light-emitting component 10 in the form of an organic light-emitting diode 10 can have a substrate 12. The substrate 12 can serve for example as a carrier element for electronic elements or layers, for example light-emitting elements. By way of example, the substrate 12 can comprise or be formed from glass, quartz, and/or a semiconductor material or any other suitable material. Furthermore, the substrate 12 can comprise or be formed from a steel foil, a plastic film or a laminate including one or including a plurality of plastic films. The plastic can comprise or be formed from one or more polyolefins (for example high or low density polyethylene (PE) or polypropylene (PP)). Furthermore, the plastic can comprise or be formed from polyvinyl chloride (PVC), polystyrene (PS), polyester and/or polycarbonate (PC), polyethylene terephthalate (PET), polyether sulfone (PES) and/or polyethylene naphthalate (PEN). The substrate 12 can comprise one or more of the materials mentioned above. The substrate 12 can be embodied as translucent or even transparent.

In various embodiments, the term "translucent" or "translucent layer" can be understood to mean that a layer is transmissive to light, for example to the light generated by the light-emitting component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion. Consequently, in various embodiments, "transparent" should be regarded as a special case of "translucent".

For the case where, for example, a light-emitting monochromatic or emission spectrum-limited electronic component is intended to be provided, it suffices for the optically translucent layer structure to be translucent at least in a partial range of the wavelength range of the desired monochromatic light or for the limited emission spectrum.

In various embodiments, the light-emitting component 10 can be designed as a top emitter or as a bottom emitter or as a top and bottom emitter. A top and bottom emitter can also be designated as an optically transparent component, for example a transparent organic light-emitting diode.

In various embodiments, a barrier layer (not illustrated in the figures) can optionally be arranged on or above the substrate 12. The barrier layer can comprise or consist of one or more of the following materials: aluminum oxide, zinc oxide, zirconium oxide, titanium oxide, hafnium oxide, tantalum oxide lanthanium oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer can have a layer thickness in a range of approximately 0.1 nm (one atomic layer) to approximately 5000 nm, for example a layer thickness in a range of approximately 10 nm to approximately 200 nm, for example a layer thickness of approximately 40 nm.

An electrically active region of the light-emitting component 10 can be arranged on or above the barrier layer. The electrically active region can be understood as that region of the light-emitting component 10 in which an electric current for the operation of the light-emitting component 10 flows. In various embodiments, the electrically active region can have a first electrode 13, a second electrode 15 and an organic functional layer structure 14, as will be explained in even greater detail below.

In this regard, in various embodiments, the first electrode 13 (for example in the form of a first electrode layer 13) can be applied on or above the barrier layer (or, if the barrier layer is not present, on or above the substrate 12). The first electrode 13 (also designated hereinafter as bottom electrode 13) can be formed from an electrically conductive material, such as, for example, a metal or a transparent conductive oxide (TCO) or a layer stack including a plurality of layers of the same metal or different metals and/or the same TCO or different TCOs. Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped.

In various embodiments, the first electrode 13 can comprise a metal; for example Ag, Pt, Au, Mg, Al, Ba, In, Ag, Au, Mg, Ca, Sm or Li, and compounds, combinations or alloys of these materials.

In various embodiments, the first electrode 13 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

In various embodiments, the first electrode 13 can provide one or a plurality of the following materials as an alternative or in addition to the abovementioned materials: networks composed of metallic nanowires and nanoparticles, for example composed of Ag; networks composed of carbon nanotubes; graphene particles and graphene layers; networks composed of semiconducting nanowires.

Furthermore, the first electrode 13 can comprise electrically conductive polymers or transition metal oxides or transparent electrically conductive oxides.

In various embodiments, the first electrode 13 and the substrate 12 can be formed as translucent or transparent. In the case where the first electrode 13 is formed from a metal, the first electrode 13 can have for example a layer thickness of less than or equal to approximately 25 nm, for example a layer thickness of less than or equal to approximately 20 nm, for example a layer thickness of less than or equal to approximately 18 nm. Furthermore, the first electrode can have for example a layer thickness of greater than or equal to approximately 10 nm, for example a layer thickness of greater than or equal to approximately 15 nm. In various embodiments, the first electrode 13 can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case where the first electrode 13 is formed from a transparent conductive oxide (TCO), the first electrode 13 can have for example a layer thickness in a range of approximately 50 nm to approximately 500 nm, for example a layer thickness in a range of approximately 75 nm to approximately 250 nm, for example a layer thickness in a range of approximately 10 nm to approximately 150 nm.

Furthermore, for the case where the first electrode 13 is formed from, for example, a network composed of metallic nanowires, for example composed of Ag, which can be combined with conductive polymers, a network composed of carbon nanotubes which can be combined with conductive polymers, or from graphene layers and composites, the first electrode 13 can have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

The first electrode 13 can be formed as an anode, that is to say as a hole-injecting electrode, or as a cathode, that is to say as an electron-injecting electrode.

The first electrode 13 is electrically corrected to a contact 16, to which a first electrical potential (provided by an energy source (not illustrated), for example a current source or a voltage source) can be applied. The first electrical potential can be, for example, the ground potential or some other predefined reference potential.

Furthermore, the electrically active region of the light-emitting component 10 has the organic functional layer structure 14, which is applied on or above the first electrode 13. The fact that the layer structure is functional can mean that the layer structure is electroluminescent. In this context, the organic functional layer structure 14 can also be designated as an organic electroluminescent layer structure.

The organic functional layer structure 14 can contain one or a plurality of emitter layers, for example including fluorescent and/or phosphorescent emitters, and one or a plurality of hole-conducting layers (also designated as hole transport layer(s)). In various embodiments, one or a plurality of electron-conducting layers (also designated as electron transport layer(s)) can alternatively or additionally be provided.

Examples of emitter materials which can be used in the light-emitting component 10 in accordance with various embodiments for the emitter layer(s) include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl-(2-carboxypyridyl)-iridium III), green phosphorescent $Ir(ppy)_3$ (tris(2-phenylpyridine)iridium III), red phosphorescent Ru $(dtb-bpy)_3*2(PF_6)$ (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di-(p-tolyl)-amino]anthracene) and red fluorescent DCM2 (4-dicyanomethylene)-2-methyl-6-julolidyl-9-enyl-4H-pyran) as non-polymeric emitters. Such non-polymeric emitters can be deposited by means of thermal evaporation, for example. Furthermore, it is possible to use polymer emitters, which can be deposited, in particular, by means of a wet-chemical method such as spin coating, for example.

The emitter materials can be embedded in a matrix material in a suitable manner.

It should be pointed out that other suitable emitter materials are likewise provided in other embodiments.

The emitter materials of the emitter layer(s) of the light-emitting component 10 can be selected for example such that the light-emitting component 10 emits white light. The emitter layer(s) can comprise a plurality of emitter materials that emit in different colors (for example blue and yellow or blue, green and red); alternatively, the emitter layer(s) can also be constructed from a plurality of partial layers, such as a blue fluorescent emitter layer or blue phosphorescent emitter layer, a green phosphorescent emitter layer and a red phosphorescent emitter layer. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation.

The organic functional layer structure 14 can generally comprise one or a plurality of functional layers. The one or the plurality of functional layers can comprise organic polymers, organic oligomers, organic monomers, organic small, non-polymeric molecules ("small molecules") or a combination of these materials. By way of example, the organic functional layer structure 14 can comprise one or a plurality of functional layers embodied as a hole transport layer, so as to enable for example in the case of an OLED an effective hole injection into an electroluminescent layer or an electroluminescent region. Alternatively, in various embodiments, the organic functional layer structure 14 can comprise one or a plurality of functional layers embodied as an electron transport layer, so as to enable for example in an OLED an effective electron injection into an electroluminescent layer or an electroluminescent region. By way of example, tertiary amines, carbazo derivatives, conductive polyaniline or polyethylene dioxythiophene can be used as material for the hole transport layer. In various embodiments, the one or the plurality of functional layers can be embodied as an electroluminescent layer.

In various embodiments, the hole transport layer can be applied, for example deposited, on or above the first electrode 13, and the emitter layer can be applied, for example deposited, on or above the hole transport layer. In various embodiments, the electron transport layer can be applied, for example deposited, on or above the emitter layer.

In various embodiments, the organic functional layer structure 14 (that is to say for example the sum of the thicknesses of hole transport layer(s) and emitter layer(s) and electron transport layer(s)) can have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 14 can have for example a stack of a plurality of organic light-emitting diodes (OLEDs) arranged directly one above another, wherein each OLED can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 14 can have for example a stack of two, three or four OLEDs arranged directly one above another, in which case for example the organic functional layer structure 14 can have a layer thickness of a maximum of approximately 3 µm.

The light-emitting component 10 can optionally generally comprise further organic functional layers, for example arranged on or above the one or the plurality of emitter layers or on or above the electron transport layer(s), which serve to further improve the functionality and thus the efficiency of the light-emitting component 10.

The second electrode 15 (for example in the form of a second electrode layer 15) can be applied on or above the organic functional layer structure 14 or, if appropriate, on or above the one or the plurality of further organic functional layers.

In various embodiments, the second electrode 15 can comprise or be formed from the same materials as the first electrode 13, metals being particularly suitable in various embodiments.

In various embodiments, the second electrode 15 (for example for the case of a metallic second electrode 15) can have for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 15 can generally be formed in a similar manner to the first electrode 13, or differently than the latter. In various embodiments, the second electrode 15 can be formed from one or more of the materials and with the respective layer thickness, as described above in connection with the first electrode 13. In various embodiments, both the first electrode 13 and the second electrode 15 are formed as translucent or transparent. Consequently, the light-emitting component 10 illustrated in FIG. 1 can be designed as a top and bottom emitter (to put it another way as a transparent light-emitting component 10).

The second electrode 15 can be formed as an anode, that is to say as a hole-injecting electrode, or as a cathode, that is to say as an electron-injecting electrode.

The second electrode 15 can have a second electrical terminal, to which a second electrical potential (which is different than the first electrical potential), provided by the energy source, can be applied. By way of example, one of the two contacts 16 shown in FIG. 1 can be the second electrical terminal. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

An encapsulation layer 18, for example in the form of a barrier thin-film layer or a barrier thin film is formed on or above the second electrode 15 and thus on or above the electrically active region.

In the context of this application, a "barrier thin-film layer" or a "barrier thin film" can be understood to mean, for example, a layer or a layer structure which is suitable for forming a barrier against chemical impurities or atmospheric substances, in particular against water (moisture) and oxygen. In other words, the encapsulation layer 18 is formed in such a way that OLED-damaging substances such as water, oxygen or solvent cannot penetrate through it or at most very small proportions of said substances can penetrate through it.

In accordance with one configuration, the encapsulation layer 18 can be formed as an individual layer (to put it another way, as a single layer). In accordance with an alternative configuration, the encapsulation layer 18 can comprise a plurality of partial layers formed one on top of another. In other words, in accordance with one configuration, the encapsulation layer 18 can be formed as a layer stack. The encapsulation layer 18 or one or a plurality of partial layers of the encapsulation layer 18 can be formed for example by means of a suitable deposition method, e.g. by means of an atomic layer deposition (ALD) method in accordance with one configuration, e.g. a plasma enhanced atomic layer deposition (PEALD) method or a plasmaless atomic layer deposition (PLALD) method, or by means of a chemical vapor deposition (CVD) method in accordance with another configuration, e.g. a plasma enhanced chemical vapor deposition (PECVD) method or a plasmaless chemical vapor deposition (PLCVD) method, or alternatively by means of other suitable deposition methods.

By using an atomic layer deposition (ALD) method, it is possible for very thin layers to be deposited. In particular, layers having layer thicknesses in the atomic layer range can be deposited.

In accordance with one configuration, in the case of an encapsulation layer 18 having a plurality of partial layers, all the partial layers can be formed by means of an atomic layer deposition method. A layer sequence including only ALD layers can also be designated as a "nanolaminate".

In accordance with an alternative configuration, in the case of an encapsulation layer 18 including a plurality of partial layers, one or a plurality of partial layers of the encapsulation layer 18 can be deposited by means of a different deposition method than an atomic layer deposition method, for example by means of a vapor deposition method.

In accordance with one configuration, the encapsulation layer 18 can have a layer thickness of approximately 0.1 nm (one atomic layer) to approximately 450 nm, for example a layer thickness of approximately 10 nm to approximately 10 nm in accordance with one configuration, for example approximately 40 nm in accordance with one configuration.

In accordance with one configuration in which the encapsulation layer 18 comprises a plurality of partial layers, all the partial layers can have the same layer thickness. In accordance with another configuration, the individual partial layers of the encapsulation layer 18 can have different layer thicknesses. In other words, at least one of the partial layers can have a different layer thickness than one or more other partial layers.

In accordance with one configuration, the encapsulation layer 18 or the individual partial layers of the encapsulation layer 18 can be formed as a translucent or transparent layer. In other words, the encapsulation layer 18 (or the individual partial layers of the encapsulation layer 18) can consist of a translucent or transparent material (or a material combination that is translucent or transparent).

In accordance with one configuration, the encapsulation layer 18 or (in the case of a layer stack having a plurality of partial layers) one or a plurality of the partial layers of the encapsulation layer 18 can comprise or consist of one of the following materials: aluminum oxide, zinc oxide, zirconium oxide, titanium oxide, hafnium oxide, tantalum oxide lanthanium oxide, silicon oxide, silicon nitride, silicon oxynitride, indium tin oxide, indium zinc oxide, aluminum-doped zinc oxide, and mixtures and alloys thereof. In various embodiments, the encapsulation layer 18 or (in the case of a layer stack having a plurality of partial layers) one or a plurality of the partial layers of the encapsulation layer 18 can comprise one or a plurality of high refractive index materials, to put it another way one or a plurality of materials having a high refractive index, for example having a refractive index of at least 2.

On or above the encapsulation layer 18, it is possible to provide an adhesive 20 and/or a protective lacquer, by means of which, for example, a cover 22 (for example a glass cover or an encapsulation glass) is fixed, for example adhesively bonded, on the encapsulation layer 18. In various embodiments, the optically translucent layer composed of adhesive 20 and/or protective lacquer can have a layer thickness of greater than 1 μm, for example a layer thickness of several μm. In various embodiments, the adhesive 20 can comprise or be a lamination adhesive 20. The cover 22 can project beyond the adhesive 20 and/or lacquer, or the adhesive 20 and/or lacquer can protrude below the cover 22.

In various embodiments, light-scattering particles can also be embedded into the layer of the adhesive 20 (also designated as adhesive layer), which particles can lead to a further improvement in the color angle distortion and the coupling-out efficiency. In various embodiments, the light-scattering particles provided can be dielectric scattering particles, for example, such as metal oxides, for example, such as e.g. silicon oxide ($SiO_2$), zinc oxide (ZnO), zirconium oxide ($ZrO_2$), indium tin oxide (ITO) or indium zinc oxide (IZO), gallium oxide ($Ga_2Oa$), aluminum oxide, or titanium oxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like can be provided as light-scattering particles.

In various embodiments, the adhesive 20 can be designed in such a way that it itself has a refractive index which is less than the refractive index of the cover 22. Such an adhesive 20 can be, for example, a low refractive index adhesive 20 such as, for example, an acrylate having a refractive index of approximately 1.3. Furthermore, a plurality of different adhesives which form an adhesive layer sequence can be provided.

Furthermore, it should be pointed out that, in various embodiments, an adhesive 20 can also be completely dispensed with, for example in embodiments in which the cover 22, for example composed of glass, is applied by means of plasma spraying, for example.

In various embodiments, the cover 22 and/or the adhesive 20 can have a refractive index (for example at a wavelength of 633 nm) of 1.55.

Furthermore, in various embodiments, one or a plurality of antireflective layers (for example combined with the encapsulation layer 18) can additionally be provided in the light-emitting component 10.

Figure 2:
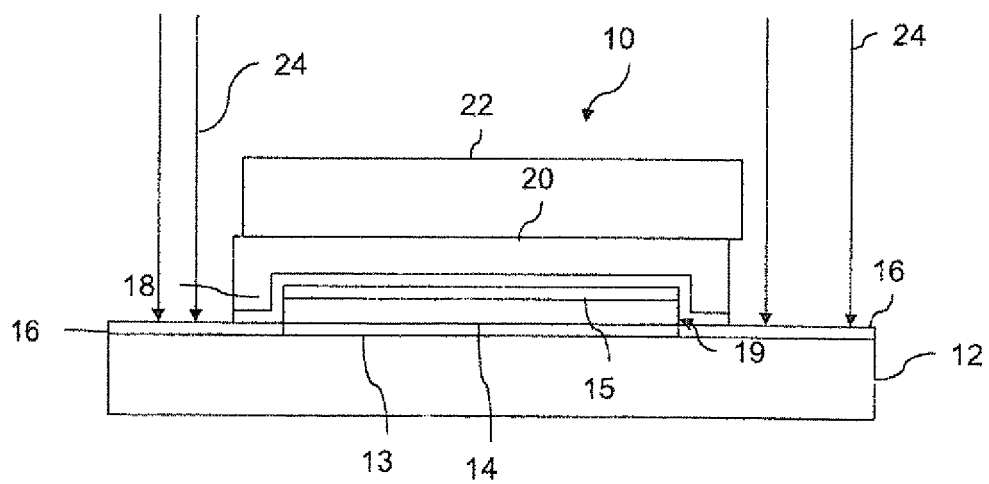
FIG. 2 shows an embodiment of an optoelectronic component during a further step of a production process.

FIG. 2 shows a cross-sectional view of the organic light-emitting component 10 in accordance with various embodiments in a subsequent step of a production process, wherein the encapsulation layer 18 was removed above the contacts 16 in an anisotropic etching method and the contacts 16 were thus exposed. In this case, the encapsulation layer 16 was bombarded in a bombardment direction 24, as explained in greater detail further below. During the anisotropic etching method, the contacts 16 can be embodied such that they are their own etching stop. By way of example, the contacts 16 can be formed from or comprise a material which is not removed, or is only slightly removed, during the anisotropic etching method, for example from chromium. Contact can subsequently be made with the contacts 16 in a simple manner, for example by means of bonding.

Figure 3:
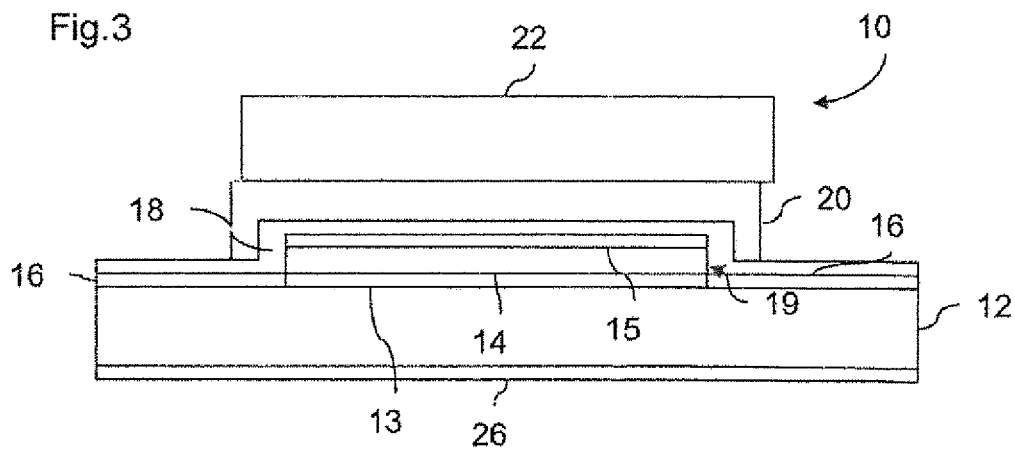
FIG. 3 shows an embodiment of an optoelectronic component during a further step of a production process.

FIG. 3 shows a cross-sectional view of the organic light-emitting component 10 in accordance with various embodiments in a for example alternative or additional step of a production process, wherein, in addition to the encapsulation layer 18, a further encapsulation layer 26 is applied on a side of the substrate 12 facing away from the cover 22. Said further encapsulation layer 26 can be removed during the anisotropic etching method for exposing the contacts 16 or in an additional anisotropic etching method. The further encapsulation layer 26 can be embodied in accordance with the encapsulation layer 18 or in a different way.

Figure 4:
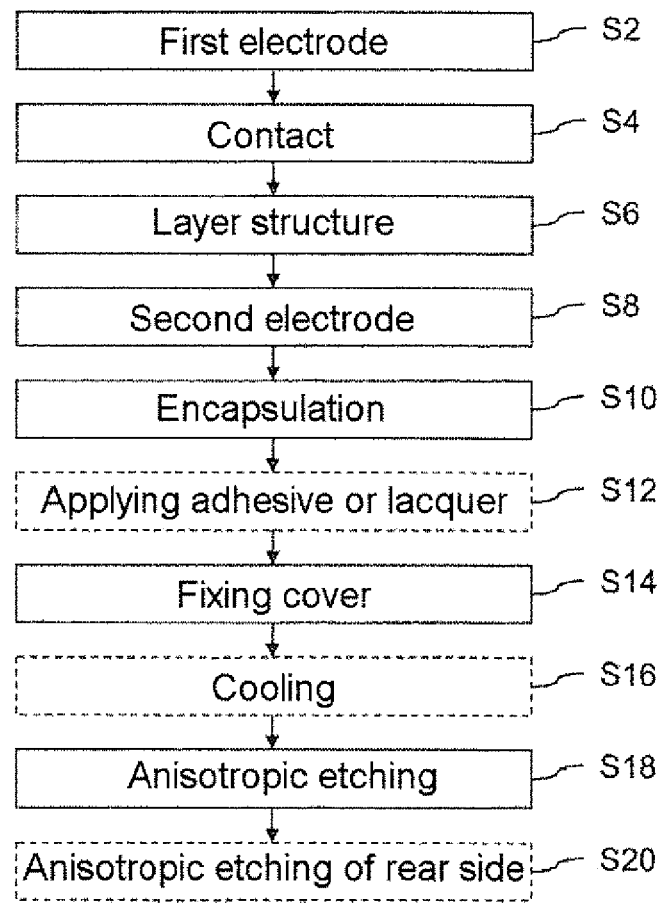
FIG. 4 shows a flow chart of an embodiment of a method for producing an optoelectronic component.

FIG. 4 shows a flow chart illustrating a method for producing the light-emitting component 10 in accordance with various embodiments.

In a step S2, the first electrode 13 is formed on the substrate.

In a step S4, the contact or contacts 16 is or are formed on the substrate 12. The contacts 16 can be connected to further contacts or conductor tracks, for example by means of ultrasonic bonding, during the method or subsequently.

In a step S6, the organic functional layer structure 14 is formed on the first electrode 13. As an alternative thereto, steps S4 and S6 can also be interchanged.

In a step S8, the second electrode 15 is formed on the organic functional layer structure 14. In other words, in steps S2 to S8, the active region of the light-emitting component is formed and contact is made with it.

In a step S10, the encapsulation layer 18 is formed.

In a step S12, which can optionally be carried out, the adhesive 20 and/or the lacquer can be applied.

In a step S14, if appropriate, the cover 22 is fixed.

In a step S16, the substrate 12 is cooled. The substrate 12 can be cooled before and/or during the anisotropic etching process. During the anisotropic etching process, the temperature of the optoelectronic component or the temperature of parts thereof can be monitored and the cooling or the process duration can be adapted to the temperature, such that overheating in the anisotropic etching process is avoided. By way of example, a temperature of the optoelectronic component can be kept at below 100° or below 90° during the anisotropic etching method. As an alternative to cooling the substrate 12, it is possible to choose the process parameters of the etching method such that the temperature of the optoelectronic component does not rise above 90° or does not rise above 100°.

In a step S18, the anisotropic etching process is carried out, by means of which the contacts 16 are exposed. A dry etching method can be carried out as the anisotropic etching method. The dry etching method comprises subtractive (removing) microstructure methods which are not based on wet-chemical reactions (such as wet-chemical etching, chemical mechanical polishing). In this case, the material removal is effected either by means of accelerated particles (e.g. argon ions) or with the aid of plasma-activated gases. Chemical and physical effects are thus utilized depending on the method. By way of example, a physical or physical-chemical dry etching method can be carried out.

During the physical dry etching methods, the surface of the substrate is etched by the bombardment of ions, electrons or else photons, for example in the bombardment direction 24. The bombardment leads to the sputtering of the substrate material; the proceeding processes are similar here to those during cathode sputtering. The methods are designated depending on particles used. The best known and most used methods are:
electron beam methods or laser vaporization. The etching is generally carried out in high-vacuum chambers in order to prevent interactions of the particle beam with the residual gas atoms (scattering, etc.). There exist methods based on concentration of the particle beam, which effect very targeted etching, and also large-area etching methods using a superficially applied mask that protects regions that are not to be etched against the particle bombardment.

The physical-chemical dry etching methods are combinations of physical and chemical dry etching methods. The chemical dry etching methods make use of a chemical reaction between neutral particles/molecules (but usually radicals) and the surface of the target. The reaction product and the starting materials used are gaseous. If a uniform supply with the etching gas is assumed, these methods are isotropic and in part highly material-selective depending on materials used. The reactions are generally carried out in a previously evacuated process chamber. For the process, the reaction gas is then introduced into the chamber. The etching process itself proceeds in principle as follows: the neutral atoms or molecules are guided into the reaction chamber through a plasma and flow over the target. They react there with the atoms situated at the surface. Volatile gaseous reaction products form and are extracted by means of a vacuum pump.

In the physical-chemical dry etching methods, the gaseous starting materials are usually activated or radicalized by means of a plasma and subsequently guided to the target for the reaction. This can be done either by means of convection or else by electrostatic acceleration of the ions by means of an electric field present. The physical-chemical dry etching methods include for example reactive ion etching (RIE), deep reactive ion etching (DRIE), reaction ion beam etching and HDP etching (high-density plasma etching).

By way of example, a plasma enhanced etching method can be carried out, for example an ICP plasma method or an RIE method. In this case, two etching mechanisms are used in one process, firstly the ion bombardment of the target and secondly a chemical reaction at the surface thereof. Physical and chemical effects are combined with one another in the following way: the bombardment with the ionized reaction gas or other ions weakens or destroys the chemical bonds of the atoms at the surface, such that the reactive gas can react more easily and thus intensifies the chemical effect in the affected regions. In this case, the bombardment with ions feeds in the energy required for the activation of the chemical reaction.

By way of example, the anisotropic etching process can be carried out in a process chamber of an etching installation.

By way of example, the anisotropic etching process can be carried out at a pressure in the process chamber of between 0 and 760 torr. A radio-frequency power (RF power) and/or an ICP power can be in a range of 1 W to 2000 W. By way of example, argon can be added as process gas at 0 to 10 000 sccm. In this case, it is possible to achieve an etching rate of 5 nm per minute, for example.

In an exemplary alternative anisotropic etching method, the pressure in the process chamber can be between 0 and 1 torr. A radio-frequency power (RF power) and/or an ICP power can be in a range of 1 W to 2000 W. By way of example argon, by way of example an argon plasma, or nitrogen trifluoride can be added as process gas at 0 to 10 000 sccm. In this case it is possible to achieve an etching rate of 35 nm per minute, for example. The use of argon plasma is advantageous for example in the case of encapsulation layers 18 which comprise $Al_2O_3$, $TiO_2$ or $ZrO_2$ or are formed therefrom.

The exact process implementation can be adapted depending on the layer construction of the encapsulation layer 18 and depending on the contacts 16, such that significant removal of the contacts 16 is prevented. The duration of the etching process can be controlled or regulated with monitoring of optical emission.

As an alternative to the two combinations of process parameters mentioned by way of example above, the process parameters mentioned can vary greatly depending on the etching installation used and depending on the type and thickness of the encapsulation layer 18. By way of example, the pressure can vary from high vacuum through to normal atmospheric pressure. Furthermore, different or further gases can be used, for example furthermore fluorine compounds, such as sulfur hexafluoride, for example.

In a step S20, which can optionally be processed, the further encapsulation layer 26 can be removed, if appropriate. Step S20 can be carried out at the same time as, before or after step S18.

The various layers, for example the encapsulation layers 18, 26, the electrodes 13, 15 and the other layers of the electrically active region such as, for example, the organic functional layer structure 14, the hole transport layer(s) or the electron transport layer(s) can be applied, for example deposited, by means of various processes, for example by means of a CVD method (chemical vapor deposition) or by means of a PVD method (physical vapor deposition, for example sputtering, ion-assisted deposition method or thermal evaporation), alternatively by means of a plating method; a dip coating method; a spin coating method; printing; blade coating; or spraying.

In various embodiments, a plasma enhanced chemical vapor deposition (PE-CVD) method can be used as CVD method. In this case, a plasma can be generated in a volume above and/or around the element to which the layer to be applied is intended to be applied, wherein at least two gaseous starting compounds are fed to the volume, said compounds being ionized in the plasma and excited to react with one another. The generation of the plasma can make it possible that the temperature to which the surface of the element is to be heated in order to make it possible to produce the dielectric layer, for example, can be reduced in comparison with a plasmaless CVD method. That may be advantageous, for example, if the element, for example the light-emitting electronic component to be formed, would be damaged at a temperature above a maximum temperature.

Furthermore, it can be provided that after forming the electrically active region and before forming the cover, the optical transparency of the structure having the electrically active region is measured. Depending on the measured optical transparency, a desired optical target transparency of the structure having the electrically active region can then be obtained for example with the aid of one or a plurality of intermediate layers or intermediate layer structures by way of example, the choice of a suitable layer thickness and/or a (choice of material of an intermediate layer or intermediate layer structure can be coordinated therewith).

In various embodiments it was recognized that the transparency of a light-emitting component such as an OLED, for example, can be increased by the use of a very thin layer having a low refractive index in comparison with the adhesive 20 and cover 22 (both of which usually have approximately the same refractive index). In various embodiments, the layer thickness is in a range of 50 nm to 150 nm. As explained above, the transparency of the light-emitting component can be significantly increased depending on the refractive index and the thickness of the layer.

In various embodiments, such a low refractive index layer (i.e. for example having a refractive index of less than 1.5) can be introduced in the ongoing process flow as an additional layer on the encapsulation, for example the thin-film encapsulation.

As explained above, a low refractive index intermediate layer or low refractive index intermediate layer structure increases the transparency of the light-emitting component 10, without significantly altering the total thickness of the light-emitting component 10.

It is likewise possible to use a low refractive index intermediate layer or low refractive index intermediate layer structure to compensate for changes in the transparency on account of process fluctuations of thin metal films within the light-emitting component, for example an OLED. For this purpose, after the encapsulation of the light-emitting component 10, the transparency can be measured and, if there is a negative deviation with respect to the target value, then said deviation can be compensated for by means of such a thin low refractive index intermediate layer or low refractive index intermediate layer structure.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCE SIGNS

10 Light-emitting component
12 Substrate
13 First electrode
14 Organic functional layer structure
15 Second electrode
16 Contact
18 Encapsulation layer
19 Flank
20 Adhesive
22 Cover
24 Bombardment direction
26 Further encapsulation layer
S2-S20 Steps two to twenty

The invention claimed is:
1. A method for producing an optoelectronic component, the method comprising:
forming a first electrode on a substrate;
forming an organic functional layer structure on the first electrode;
forming a second electrode on the organic functional layer structure;

forming at least one contact for making contact with the first and/or second electrode;
forming an encapsulation layer above the layer structure and the contact;
applying a lacquer to the encapsulation layer above and/or alongside the layer structure so that the lacquer serves as an etching stop for the layer structure and/or a flank of the layer structure during anisotropic etching;
removing the encapsulation layer above the contact with the aid of an anisotropic etching method; and
cooling the substrate during the anisotropic etching method.

2. A method for producing an optoelectronic component, the method comprising:
forming a first electrode on a substrate;
forming an organic functional layer structure on the first electrode;
forming a second electrode on the organic functional layer structure;
forming at least one contact for making contact with the first and/or second electrode;
forming an encapsulation layer above the layer structure and the contact and a further encapsulation layer on a rear side of the substrate facing away from the layer structure; and
applying a lacquer to the encapsulation layer above and/or alongside the layer structure so that the lacquer serves as an etching stop for the layer structure and/or a flank of the layer structure during anisotropic etching;
removing the encapsulation layer above the contact with the aid of an anisotropic etching method and removing the further encapsulation layer on the rear side with the aid of the anisotropic etching method or an additional anisotropic etching method.

3. The method as claimed in claim 1, wherein the optoelectronic component is a light-emitting component.

4. The method as claimed in claim 3, wherein the optoelectronic component is an organic light-emitting diode.

5. The method as claimed in claim 1, wherein a dry etching method is carried out as the anisotropic etching method.

6. The method as claimed in claim 5, wherein a physical or physical-chemical dry etching method is carried out as the dry etching method.

7. The method as claimed in claim 6, wherein a plasma-enhanced etching method is carried out as the dry etching method.

8. The method as claimed in claim 7, wherein an ICP plasma method is carried out as the dry etching method.

9. The method as claimed in claim 1, wherein a cover is fixed above the layer structure on the encapsulation layer with the aid of an adhesive, said cover serving as an etching stop for the encapsulation layer above the layer structure during the anisotropic etching method.

10. The method as claimed in claim 1, wherein the contact is embodied such that it serves as its own etching stop and/or as an etching stop for the substrate during the anisotropic etching method.

11. The method as claimed in claim 1, wherein at least the encapsulation layer is embodied as two or more partial layers above the layer structure and the contact, and wherein the partial layers above the contact are removed with the aid of the anisotropic etching method.

12. An optoelectronic component embodied with the aid of a method, the method comprising:
forming a first electrode on a substrate;
forming an organic functional layer structure on the first electrode;
forming a second electrode on the organic functional layer structure;
forming at least one contact for making contact with the first and/or second electrode;
forming an encapsulation layer above the layer structure and the contact;
applying a lacquer to the encapsulation layer above and/or alongside the layer structure so that the lacquer serves as an etching stop for the layer structure and/or a flank of the layer structure during anisotropic etching;
removing the encapsulation layer above the contact with the aid of an anisotropic etching method; and
cooling the substrate during the anisotropic etching method.

13. The method as claimed in claim 2, wherein the optoelectronic component is a light-emitting component.

14. The method as claimed in claim 13, wherein the optoelectronic component is an organic light-emitting diode.

15. The method as claimed in claim 2, wherein a dry etching method is carried out as the anisotropic etching method.

16. The method as claimed in claim 15, wherein a physical or physical-chemical dry etching method is carried out as the dry etching method.

17. The method as claimed in claim 16, wherein a plasma-enhanced etching method is carried out as the dry etching method.

18. The method as claimed in claim 17, wherein an ICP plasma method is carried out as the dry etching method.

19. The method as claimed in claim 2, wherein a cover is arranged above the layer structure on the encapsulation layer, said cover serving as an etching stop for the encapsulation layer above the layer structure during the anisotropic etching method.

20. The method as claimed in claim 19, wherein the cover is fixed with the aid of adhesive.

21. The method as claimed in claim 20, wherein the adhesive serves as an etching stop for the encapsulation layer above the layer structure during the anisotropic etching method.

22. The method as claimed in claim 20, wherein the adhesive is applied such that it covers at least one flank of the layer structure and thus serves as an etching stop for the corresponding flank during the anisotropic etching method.

23. The method as claimed in claim 2, wherein a lacquer is applied above and/or alongside the layer structure in such a way that the lacquer serves as an etching stop for the layer structure and/or a flank of the layer structure during the anisotropic etching method.

24. The method as claimed in claim 2, wherein the contact is embodied such that it serves as its own etching stop and/or as an etching stop for the substrate during the anisotropic etching method.

25. The method as claimed in claim 2, wherein at least the encapsulation layer is embodied as two or more partial layers above the layer structure and the contact, and wherein the partial layers above the contact are removed with the aid of the anisotropic etching method.

26. An optoelectronic component embodied with the aid of a method, the method comprising:
forming a first electrode on a substrate;
forming an organic functional layer structure on the first electrode;
forming a second electrode on the organic functional layer structure;
forming at least one contact for making contact with the first and/or second electrode;

forming an encapsulation layer above the layer structure and the contact and a further encapsulation layer on a rear side of the substrate facing away from the layer structure; and applying a lacquer to the encapsulation layer above and/or alongside the layer structure so that the lacquer serves as an etching stop for the layer structure and/or a flank of the layer structure during anisotropic etching;

removing the encapsulation layer above the contact with the aid of an anisotropic etching method and removing the further encapsulation layer on the rear side with the aid of the anisotropic etching method or an additional anisotropic etching method.

* * * * *